(12) United States Patent
Shen et al.

(10) Patent No.: US 10,971,367 B2
(45) Date of Patent: Apr. 6, 2021

(54) METHOD FOR FABRICATING VERTICAL TRANSISTOR HAVING A SILICIDED BOTTOM

(71) Applicants: Semiconductor Manufacturing International (Shanghai) Corporation, Shanghai (CN); Semiconductor Manufacturing International (Beijing) Corporation, Beijing (CN)

(72) Inventors: Zhaoxu Shen, Shanghai (CN); Duohui Bei, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/933,761

(22) Filed: Jul. 20, 2020

(65) Prior Publication Data

US 2020/0350174 A1    Nov. 5, 2020

Related U.S. Application Data

(62) Division of application No. 15/918,741, filed on Mar. 12, 2018, now Pat. No. 10,755,937.

(30) Foreign Application Priority Data

Apr. 7, 2017   (CN) .......................... 201710222205.8

(51) Int. Cl.
*H01L 21/285*   (2006.01)
*H01L 29/786*   (2006.01)
(Continued)

(52) U.S. Cl.
CPC .... *H01L 21/28518* (2013.01); *H01L 21/0217* (2013.01); *H01L 21/02164* (2013.01);
(Continued)

(58) Field of Classification Search
CPC ..... H01L 21/823814; H01L 21/823431; H01L 21/823437; H01L 21/823475;
(Continued)

(56) References Cited

U.S. PATENT DOCUMENTS 7,741,197 B1 *  6/2010  Duan ................ H01L 21/02603
                                                    438/478
7,791,108 B2    9/2010  Hurkx et al.
(Continued)

FOREIGN PATENT DOCUMENTS

| CN | 105789302 A | 7/2016 |
|---|---|---|
| CN | 106328521 A | 1/2017 |
| WO | 2016207127 A | 12/2016 |

OTHER PUBLICATIONS

U.S. Appl. No. 15/918,741, Final Office Action, dated Dec. 31, 2019, 12 pages.
(Continued)

*Primary Examiner* — Victoria K. Hall
(74) *Attorney, Agent, or Firm* — Anova Law Group, PLLC (57) ABSTRACT

A method of manufacturing a semiconductor device includes providing a substrate structure including a substrate and a semiconductor column vertically protruding from the substrate, sequentially forming a first protective layer and a second protective layer on the substrate, etching a portion of the second protective layer to expose a portion of the first protective layer on the substrate and a portion of the first protective layer on an upper surface of the semiconductor column, removing the exposed portion of the first protective (Continued)

layer on the substrate to expose a lower portion of the semiconductor column, removing a remaining portion of the second protective layer, and forming a first contact material layer on the substrate and in contact with the lower portion of the semiconductor column. The first contact material layer in contact with the lower portion of the semiconductor column does not increase the source series resistance.

16 Claims, 9 Drawing Sheets

(51) Int. Cl.
| | |
|---|---|
| H01L 21/02 | (2006.01) |
| H01L 21/311 | (2006.01) |
| H01L 21/28 | (2006.01) |
| H01L 29/06 | (2006.01) |
| H01L 29/423 | (2006.01) |
| H01L 29/45 | (2006.01) |
| H01L 29/49 | (2006.01) |
| H01L 29/66 | (2006.01) |

(52) U.S. Cl.
CPC .. *H01L 21/02532* (2013.01); *H01L 21/02603* (2013.01); *H01L 21/28079* (2013.01); *H01L 21/31116* (2013.01); *H01L 29/0676* (2013.01); *H01L 29/42392* (2013.01); *H01L 29/458* (2013.01); *H01L 29/4908* (2013.01); *H01L 29/66742* (2013.01); *H01L 29/66772* (2013.01); *H01L 29/78642* (2013.01); *H01L 29/78651* (2013.01); *H01L 29/78654* (2013.01); *H01L 29/78696* (2013.01)

(58) Field of Classification Search
CPC ....... H01L 21/823487; H01L 21/02603; H01L 21/31116; H01L 29/41791; H01L 29/0676; H01L 29/42392; H01L 29/66795; H01L 29/66787; H01L 29/785; H01L 29/7851; H01L 29/7858; H01L 29/78696; H01L 29/78642; H01L 27/0886; H01L 27/0924
See application file for complete search history.

(56) References Cited

U.S. PATENT DOCUMENTS

| | | | |
|---|---|---|---|
| 8,129,247 B2 | 3/2012 | Bangsaruntip et al. | |
| 8,637,849 B2 | 1/2014 | Deligianni et al. | |
| 9,502,265 B1 | 11/2016 | Jiang et al. | |
| 9,564,370 B1 | 2/2017 | Ok et al. | |
| 9,653,288 B1 | 5/2017 | Holland et al. | |
| 9,653,585 B2 | 5/2017 | Zhang | |
| 9,768,252 B2 | 9/2017 | Holland et al. | |
| 9,773,913 B1 | 9/2017 | Balakrishnan et al. | |
| 9,825,032 B1* | 11/2017 | Bentley | H01L 27/092 |
| 9,831,131 B1 | 11/2017 | Jacob | |
| 9,929,242 B2 | 3/2018 | Chang et al. | |
| 9,947,793 B1 | 4/2018 | Xie et al. | |
| 9,966,456 B1 | 5/2018 | Park et al. | |
| 9,997,413 B1* | 6/2018 | Leobandung | H01L 21/823871 |
| 10,014,372 B1 | 7/2018 | Leobandung | |
| 10,062,752 B1 | 8/2018 | Leobandung | |
| 10,103,154 B2* | 10/2018 | Masuoka | H01L 21/28247 |
| 10,158,021 B2 | 12/2018 | Xie et al. | |
| 10,170,376 B1 | 1/2019 | Hung | |
| 10,186,580 B2 | 1/2019 | Rachmady et al. | |
| 10,211,109 B1 | 2/2019 | Leobandung | |
| 10,211,288 B1* | 2/2019 | Bi | H01L 29/78642 |
| 10,243,041 B2* | 3/2019 | Mallela | H01L 29/78642 |
| 10,249,538 B1 | 4/2019 | Qi et al. | |
| 10,269,956 B2 | 4/2019 | Leobandung | |
| 10,297,513 B1 | 5/2019 | Yamashita et al. | |
| 10,325,852 B2* | 6/2019 | Leobandung | H01L 21/84 |
| 10,622,489 B2* | 4/2020 | Yeung | H01L 29/423 |
| 10,741,453 B2* | 8/2020 | Li | H01L 29/66636 |
| 10,804,375 B2* | 10/2020 | Yun | H01L 29/66787 |
| 10,832,970 B2* | 11/2020 | Lee | H01L 29/45 |
| 10,832,975 B2* | 11/2020 | Bao | H01L 21/823892 |
| 2006/0008942 A1 | 1/2006 | Romano et al. | |
| 2006/0202266 A1 | 9/2006 | Radosavljevic et al. | |
| 2009/0294757 A1 | 12/2009 | Wernersson et al. | |
| 2009/0321716 A1 | 12/2009 | Wernersson et al. | |
| 2010/0176459 A1 | 7/2010 | Wernersson et al. | |
| 2011/0012085 A1 | 1/2011 | Deligianni et al. | |
| 2011/0133162 A1 | 6/2011 | Bangsaruntip et al. | |
| 2011/0198676 A1* | 8/2011 | Luo | H01L 29/7851 257/288 |
| 2013/0240983 A1 | 9/2013 | Larrieu | |
| 2013/0264544 A1 | 10/2013 | Karg et al. | |
| 2014/0061775 A1 | 3/2014 | Chuang et al. | |
| 2014/0170821 A1 | 6/2014 | Nyhus et al. | |
| 2015/0076596 A1 | 3/2015 | Colinge et al. | |
| 2015/0295040 A1 | 10/2015 | Tsai et al. | |
| 2015/0357432 A1 | 12/2015 | Lin et al. | |
| 2015/0364601 A1 | 12/2015 | Kuang et al. | |
| 2016/0020306 A1 | 1/2016 | Huang et al. | |
| 2016/0093745 A1 | 3/2016 | Diaz et al. | |
| 2016/0268376 A1* | 9/2016 | Shih | H01L 29/78684 |
| 2016/0293739 A1 | 10/2016 | Zhang | |
| 2017/0005168 A1 | 1/2017 | Doornbos et al. | |
| 2017/0213905 A1 | 7/2017 | Lee et al. | |
| 2017/0301679 A1* | 10/2017 | Masuoka | H01L 27/1108 |
| 2017/0365522 A1* | 12/2017 | Jeong | H01L 21/823418 |
| 2018/0006118 A1* | 1/2018 | Mallela | H01L 29/7827 |
| 2018/0040740 A1 | 2/2018 | Cantoro et al. | |
| 2018/0053840 A1* | 2/2018 | Mallela | H01L 21/764 |
| 2018/0097106 A1 | 4/2018 | Zhu | |
| 2018/0204931 A1* | 7/2018 | Reboh | H01L 29/78618 |
| 2018/0261694 A1 | 9/2018 | Dewey et al. | |
| 2018/0294331 A1 | 10/2018 | Cho et al. | |
| 2019/0035932 A1 | 1/2019 | Zhou | |
| 2019/0058053 A1 | 2/2019 | Dewey et al. | |
| 2019/0148376 A1 | 5/2019 | Chanemougame et al. | |
| 2019/0214266 A1* | 7/2019 | Posseme | H01L 21/31116 |
| 2019/0378767 A1* | 12/2019 | Bao | H01L 29/0847 |
| 2020/0227413 A1* | 7/2020 | Ward | H01L 21/76897 |
| 2020/0266201 A1* | 8/2020 | Li | H01L 29/0847 |

OTHER PUBLICATIONS

U.S. Appl. No. 15/918,741, Non-Final Office Action, dated Aug. 21, 2019, 17 pages.

* cited by examiner

METHOD FOR FABRICATING VERTICAL TRANSISTOR HAVING A SILICIDED BOTTOM

CROSS-REFERENCES TO RELATED APPLICATIONS

This application is a divisional of U.S. patent application Ser. No. 15/918,741, filed on Mar. 12, 2018, now U.S. Pat. No. 10,755,937, issued on Aug. 25, 2020, which claims priority to Chinese patent application No. 201710222205.8, filed with the State Intellectual Property Office of People's Republic of China on Apr. 7, 2017, the content of which are incorporated herein by reference in their entirety.

FIELD OF THE INVENTION

The present invention relates to integrated semiconductor devices, and more particularly to a vertical transistor and method for manufacturing the same.

BACKGROUND OF THE INVENTION

As the critical dimension of metal oxide semiconductor field effect transistor (MOSFET) devices continues to shrink, the short channel effect becomes more problematic. Fin field effect transistor (FinFET) devices have better control capability of gates than planar MOSFET devices to effectively suppress the short channel effect. Gate-all-around (GAA) devices have even better control ability than FinFET devices to more effectively suppress the short channel effect.

A nanowire vertical transistor is an example of a GAA device.

Figure 1A:
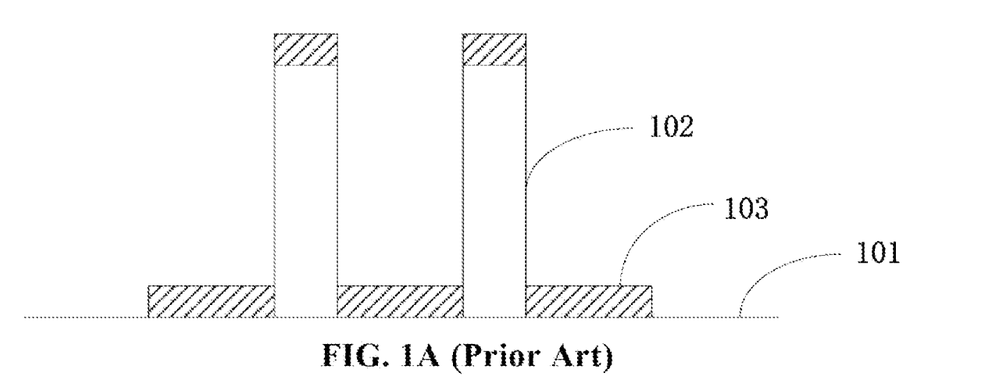
FIG. 1A is a cross-sectional view illustrating an intermediate stage of a nanowire vertical transistor manufactured with one conventional method according to the prior art.

In some conventional methods of manufacturing nanowire vertical transistors, after nanowires 102 are formed on a substrate 101, a contact material 103 is then formed on substrate 101 and on upper surfaces of nanowires 102 by an anisotropic deposition, as shown in FIG. 1A. However, contact material 103 is inevitably formed on sidewalls of nanowires 102, thereby reacting with nanowires 102 to form a metal silicide. The presence of the metal silicide affects the channel performance of nanowires, thereby affecting the performance of nanowire vertical transistors.

Figure 1B:
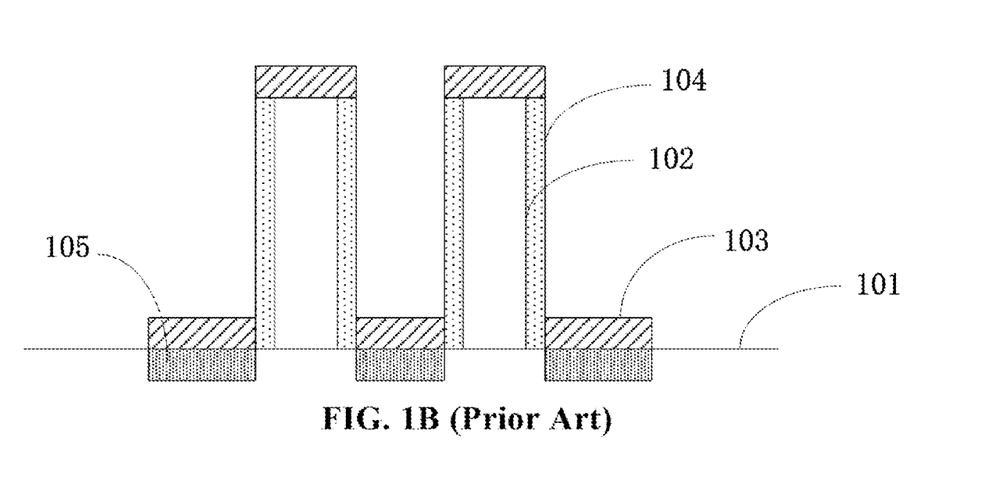
FIG. 1B is a cross-sectional view illustrating an intermediate stage of a nanowire vertical transistor manufactured with another conventional method according to the prior art.

In some other conventional methods of manufacturing a nanowire vertical transistor, after nanowires 102 are formed on a substrate 101, a gate dielectric layer 104 is formed on sidewalls of nanowires 102. A contact material 103 is formed on substrate 101 and on upper surfaces of nanowires by an anisotropic deposition, as shown in FIG. 1B. This method may prevent contact material 103 from being formed on the sidewalls of nanowires 102. Since contact material 103 does not come into contact with the bottom of nanowires 102, a metal silicide 105 is only formed in substrate 101 but not at the bottom of nanowires 102, this will increase the series resistance of a source.

Therefore, there is a need for improved methods for manufacturing a fin-type semiconductor device to overcome these drawbacks.

BRIEF SUMMARY OF THE INVENTION

The present inventors discovered the above-described problems and provide a novel technical solution for solving at least one of the above-described problems.

In one aspect of the present invention, a method for manufacturing a semiconductor device is provided. The method may include providing a substrate structure including a substrate and a semiconductor column vertically protruding from the substrate, sequentially forming a first protective layer and a second protective layer on the substrate, etching a portion of the second protective layer to expose a portion of the first protective layer on the substrate and a portion of the first protective layer on an upper surface of the semiconductor column, removing the exposed portion of the first protective layer on the substrate to expose a lower portion of the semiconductor column, removing a remaining portion of the second protective layer, and forming a first contact material layer on the substrate and in contact with the lower portion of the semiconductor column.

In one embodiment, the substrate structure further includes an insulating layer on a region of the substrate not covered by the semiconductor column. And removing the exposed portion of the first protective layer on the substrate includes removing the insulating layer.

In one embodiment, the semiconductor column includes a semiconductor layer and a hardmask layer on the semiconductor layer, the method further includes, prior to forming the first contact material layer, removing the hardmask layer.

In one embodiment, the semiconductor column further includes a buffer layer between the semiconductor layer and the hardmask layer.

In one embodiment, the first protective layer includes silicon oxide, and the second protective layer includes silicon nitride.

In one embodiment, the method further includes removing a remaining portion of the first protective layer.

In one embodiment, the method further includes forming a first insulating material layer on the first contact material layer, forming a gate dielectric material layer on the semiconductor column and on the first insulating material layer, forming a gate material layer on the gate dielectric material layer, forming a second insulating material layer on the gate material layer, the second insulating material layer having an upper surface lower than an upper surface of the semiconductor column, removing a portion of the gate dielectric material layer on the semiconductor column above the upper surface of the second insulating material layer to expose an upper portion of the semiconductor column, and forming a second contact material layer on the upper portion of the semiconductor column.

In one embodiment, the first protective layer includes a dielectric material layer, the method further includes forming a first insulating material layer on the first contact material layer, forming a gate material layer on the first insulating material layer, forming a second insulating material layer on the gate material layer, the second insulating material layer having an upper surface lower than an upper surface of the semiconductor column, removing a portion of the first protective layer on sidewalls of the semiconductor column above the upper surface of the second insulating material layer to expose an upper portion of the semiconductor column, and forming a second contact material layer on the upper portion of the semiconductor column.

In one embodiment, the method may further include forming a first contact extending to the first contact material layer, a second contact extending to the gate material layer, and a third contact in contact with the second contact material layer.

In one embodiment, the second contact material layer comprises tungsten, nickel, cobalt, titanium, or platinum.

In one embodiment, the semiconductor column is a nanowire. In one embodiment, the semiconductor column includes an array of semiconductor pillars. In one embodiment, the semiconductor column includes silicon.

In one embodiment, the first contact material layer includes tungsten, nickel, cobalt, titanium, or platinum.

In one aspect of the present invention, a semiconductor device includes a substrate, a semiconductor column vertically protruding from the substrate, and a first contact material layer on the substrate and in contact with a lower portion of the semiconductor column, the first contact material layer includes a recess adjacent to the semiconductor column.

In one embodiment, the semiconductor device also includes a first insulating material layer on the first contact material layer, a gate dielectric material layer on a middle portion of the semiconductor column and on the first insulating material layer exposing an upper portion of the semiconductor column, a gate material layer on the gate dielectric material layer, a second insulating material layer on the gate material layer, the second insulating material layer having an upper surface lower than an upper surface of the semiconductor column, and a second contact material layer on the upper portion of the semiconductor column.

In one embodiment, the semiconductor device further includes a first contact extending to the first contact material layer, a second contact extending to the gate material layer, and a third contact in contact with the second contact material layer.

In one embodiment, wherein the semiconductor column is a nanowire. In one embodiment, the semiconductor column includes an array of semiconductor pillars. In one embodiment, the semiconductor column includes silicon.

In one embodiment, the first contact material layer includes tungsten, nickel, cobalt, titanium, or platinum. In one embodiment, the second contact material layer includes tungsten, nickel, cobalt, titanium, or platinum.

In yet another aspect of the present invention, a semiconductor device may include a substrate, a semiconductor column vertically protruding from the substrate, a gate dielectric material layer on a middle portion of the semiconductor column exposing an upper portion and a lower portion of the semiconductor column, a first contact material layer on the substrate and in contact with the lower portion of the semiconductor column, a first insulating material layer on the first contact material layer, a gate material layer on the first insulating material layer, a second insulating material layer on the gate material layer and having an upper surface flush with an upper surface of the gate dielectric material layer, and a second contact material layer on the upper portion of the semiconductor column.

In one embodiment, the first contact material layer covers a portion of the gate dielectric material layer.

In one embodiment, the semiconductor may further include a first contact extending to the first contact material layer, a second contact extending to the gate material layer, and a third contact in contact with the second contact material layer.

The following detailed description together with the accompanying drawings will provide a better understanding of the nature and advantages of the present invention.

BRIEF DESCRIPTION OF THE DRAWINGS

The accompanying drawings, referred to herein and constituting a part hereof, illustrate embodiments of the disclosure. The drawings together with the description serve to explain the principles of the invention.

DETAILED DESCRIPTION OF THE INVENTION

Embodiments of the present invention now will be described more fully hereinafter with reference to the accompanying drawings. The invention may, however, be embodied in many different forms and should not be construed as limited to the embodiments set forth herein. Rather, these embodiments are provided so that this disclosure will be thorough and complete, and will fully convey the scope of the invention to those skilled in the art. The features may not be drawn to scale, some details may be exaggerated relative to other elements for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises", "comprising", "includes", and/or "including" when used herein, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments and intermediate structures) of the invention. The thickness of layers and regions in the drawings may be enlarged relative to other layers and regions for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Embodiments of the present invention now will be described more fully hereinafter with reference to the accompanying drawings, in which embodiments of the invention are shown. This invention may, however, be embodied in many different forms and should not be construed as limited to the embodiments set forth herein.

Figure 2:
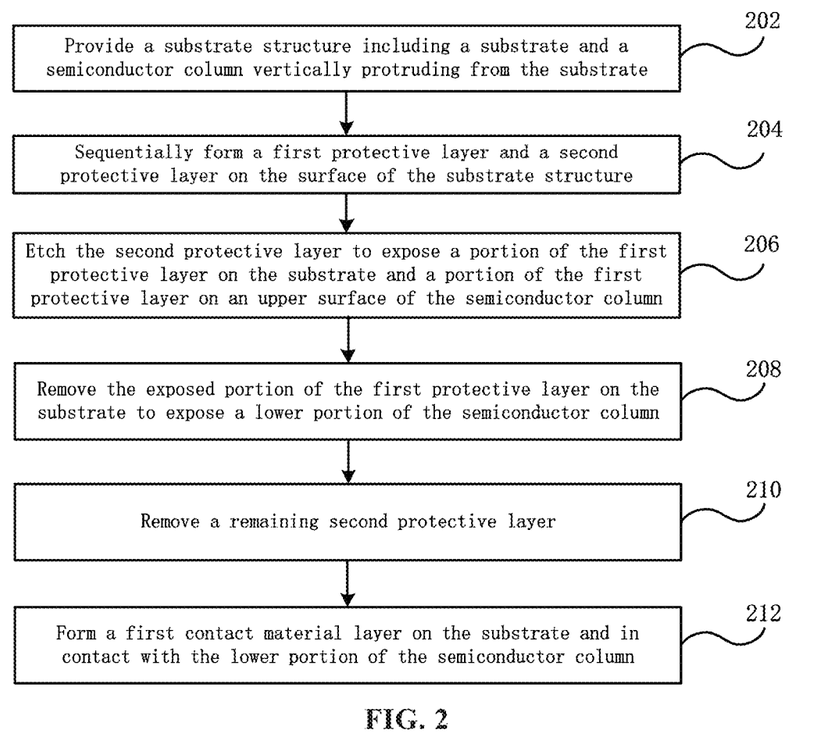
FIG. 2 is a flowchart of a method for manufacturing a semiconductor device according to some embodiments of the present invention.

FIG. 2 is a flowchart of a method for manufacturing a semiconductor device according to some embodiments of the present invention. Referring to FIG. 2, the method include:

Step 202: providing a substrate structure including a substrate and a semiconductor column disposed substantially vertical in relation to the surface of the substrate;

Step 204: sequentially forming a first protection layer and a second protection layer on the substrate;

Step 206: etching the second protection layer to expose a portion of the first protective layer on the substrate and a portion of the first protective layer on the upper surface of the semiconductor column.

Step 208: removing the exposed portion of the first protective layer on the substrate to expose a surface of the substrate and a lower portion of the semiconductor column.

Step 210: removing a remaining second protective layer.

Step 212: forming a first contact material layer on the substrate and in contact with the lower portion of the semiconductor column.

In the embodiment, a first protective layer and a second protective layer are provided so that a first contact material layer is not formed on sidewalls of the semiconductor column. On the other hand, the first contact material layer formed on the surface of the substrate is in contact with the lower portion of the semiconductor column to prevent an increase in the series resistance of a source (e.g., formed at the lower portion of the semiconductor column).

The method of manufacturing a semiconductor device according to one embodiment of the present invention will be described in detail with reference to FIGS. 3A to 3F.

Figure 3A:
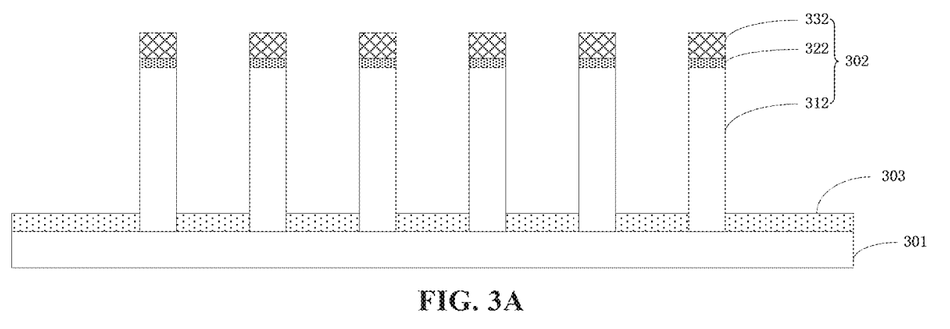
FIGS. 3A to 3F are cross-sectional views of intermediate stages of a manufacturing method of a semiconductor device according to an embodiment of the present invention.

Referring to FIG. 3A, a substrate structure is provided. The substrate structure includes a substrate 301 and a semiconductor column 302 vertically protruding from substrate 301.

Substrate 301 may be a silicon substrate, a silicon-on-insulator (SOI) substrate, and the like. Of course, the present invention is not limited thereto. Semiconductor column 302 may include, but is not limited to, silicon, III-V compound semiconductor material, or the like.

In one embodiment, semiconductor column 302 may include an array of semiconductor pillars. The array of semiconductor pillars may include one or more semiconductor pillars. In one embodiment, semiconductor column 302 may be a nanowire. As used herein, the term "nanowire" is referred to a semiconductor wire having an undoped material or a controlled doping and composite in the longitudinal or radial directions, or in both longitudinal and radial directions. The nanowire may include different materials when viewed longitudinally. The nanowire may have various cross-sectional shapes in a transverse direction perpendicular to the longitudinal direction. The various cross-sectional shapes may be circular, oval, square, rectangular, and hexagonal.

In one embodiment, referring to FIG. 3A, semiconductor column 302 may include a semiconductor layer 312, and a hardmask layer 332 on semiconductor layer 312. Hardmask layer 332 may include silicon nitride, silicon oxynitride, or silicon carbonitride. In one embodiment, semiconductor column 302 may also include a buffer layer 322 (e.g., silicon oxide) disposed between semiconductor layer 312 and hardmask layer 332.

In one embodiment, the substrate structure may further include an insulating layer 303 (e.g., silicon oxide) on a region where substrate 301 is not covered by semiconductor column 302. Insulating layer 303 will be removed in a subsequent process step to expose a lower portion of semiconductor column 302. In one embodiment, insulating layer 303 may be formed by first depositing an insulating material layer on the substrate structure including substrate 301 and semiconductor column 302; the insulating material layer is then planarized, e.g., using a chemical mechanical polishing process. Thereafter, the planarized insulating material layer is etched back to form insulating layer 303.

It is to be understood that the term "vertically protruding semiconductor column" or "vertical semiconductor column" refers to the longitudinal orientation of the semiconductor column in the vertical direction in relation to the flat surface of the substrate. As used herein, the term "substantially vertical" refers to a vertical orientation within the process variations.

Figure 3B:
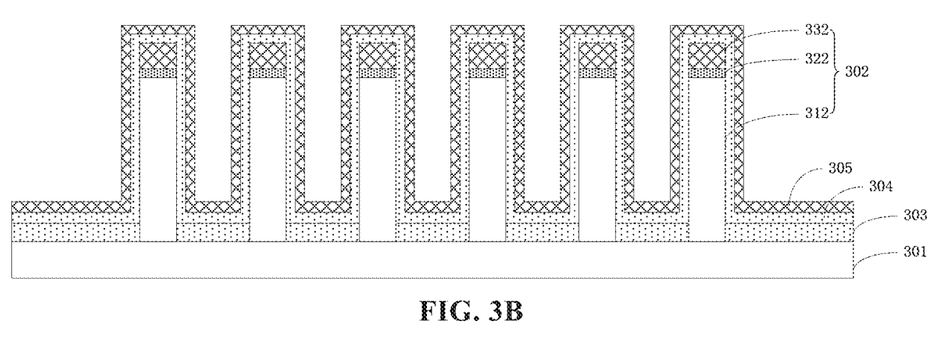

Next, referring to FIG. 3B, a first protective layer 304 and a second protective layer 305 are sequentially formed on the substrate structure.

In one embodiment, first protective layer 304 may include silicon oxide, and second protective layer 305 may include silicon nitride. In one exemplary embodiment, first protective layer 304 includes $SiO_2$, and second protective layer 305 includes carbon-containing silicon nitride, e.g., SiCN. Of course, the present invention is not limited thereto, first protective layer 304 and second protective layer 305 may include other materials as long as first protective layer 304 and second protective layer 305 have different etching selection ratios.

Figure 3C:
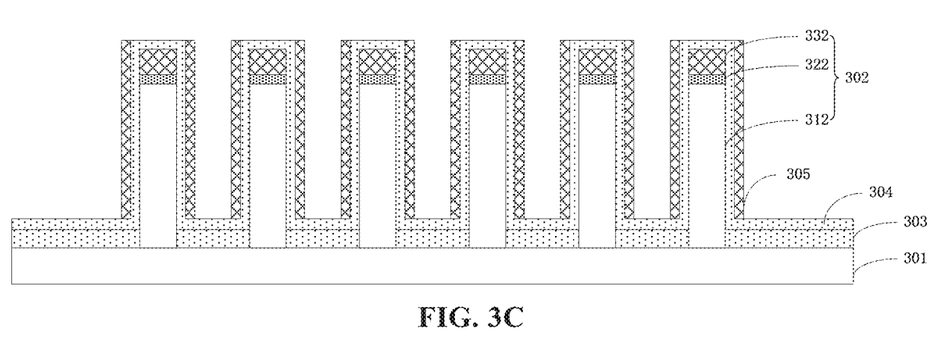

Next, referring to FIG. 3C, second protective layer 305 is etched using an etching process such as a dry etching process (e.g., reactive ion etching) so that a portion of first protective layer 304 on substrate 301 and a portion of first protective layer 304 on the upper surface of semiconductor column 302 are exposed. That is, the horizontal portions of second protective layer 305 are removed, leaving only the vertical portions of second protective layer 305 remain on sidewalls of semiconductor column 302, as shown in FIG. 3C.

Figure 3D:
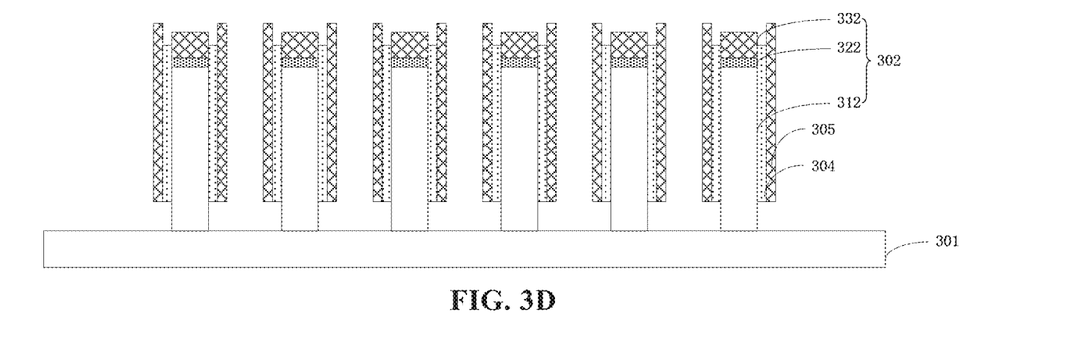

Next, referring to FIG. 3D, the exposed portions of first protective layer 304 are removed to expose the surface of substrate 301 and the lower portion of semiconductor columns 302.

It will be appreciated that, in the case where the substrate structure includes insulating layer 303, removing the exposed portions of first protective layer 304 also includes removing insulating layer 303. In practical applications, the horizontal portion of first protective layer 304 may be relatively thin, the presence of insulating layer 303 and its removal ensure that the lower portion of semiconductor columns 302 is exposed. Note that the height of the exposed lower portion of semiconductor column 302 depends on the thickness of first protective layer 304. Alternatively, in the case where substrate structure includes insulating layer 303, the height of the exposed lower portion of semiconductor column 302 depends on the thickness of insulating layer 303 and the thickness of first protective layer 304. Further, referring to FIG. 3D, during the removal of exposed portions of first protective layer 304, a portion of first protective layer 304 in the vicinity of the upper surface of semiconductor columns 302 may also be removed, so that a portion of semiconductor column 302 is exposed. That is, a portion of or entire hardmask layer 332 is exposed.

Figure 3E:
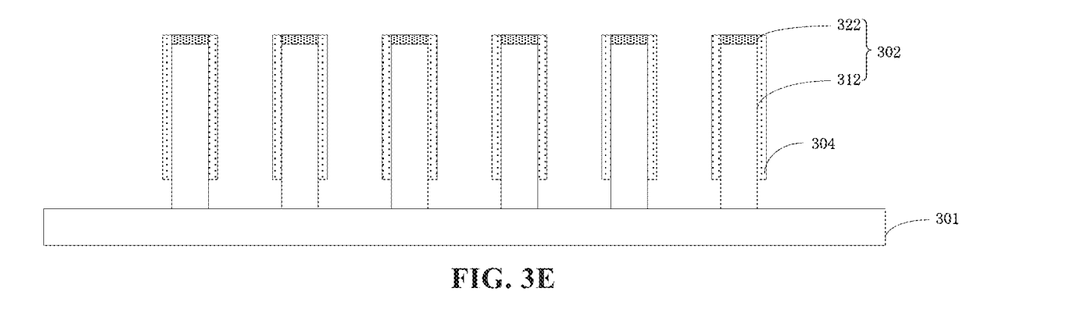

Next, referring to FIG. 3E, the remaining portion of second protective layer 305 is removed.

In the case where semiconductor column 302 includes hardmask layer 332, hardmask layer 332 is first removed prior to forming a first contact material layer. In one exemplary embodiment, hardmask layer 332 may be removed at the same time while the remaining portion of second protective layer 305 is being removed.

Figure 3F:
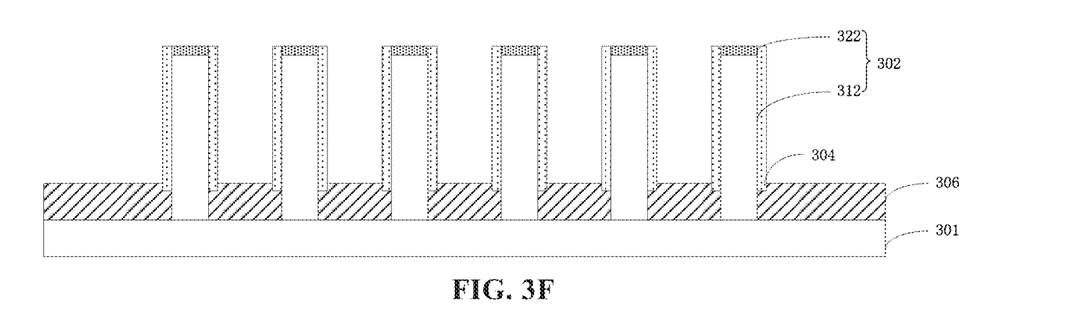

Thereafter, referring to FIG. 3F, a first contact material layer 306 is formed on the surface of the substrate and in contact with the lower portion of semiconductor column 302.

In one exemplary embodiment, a first contact material layer may be deposited on the structure shown in FIG. 3E, the deposited first contact material layer is then planarized (e.g., CMP), and the planarized first contact material layer is etched back to obtain first contact material layer 306, as shown in FIG. 3F. Since first protective layer 304 is formed on the sidewalls of semiconductor column 302, therefore, first contact material layer 306 will not be formed on the sidewalls of semiconductor columns 302. Further, first contact material layer 306 is in contact with the lower portion of semiconductor column 302 to prevent an increase in the source series resistance of the subsequently formed semiconductor device.

In one embodiment, first contact material layer 306 may include tungsten, nickel, cobalt, titanium, or platinum. In one embodiment, in the case where first contact material layer 306 includes tungsten, a barrier layer, such as a stack of Ti, Ti/TiN, may be formed between first contact material layer 306 and substrate 301 and between first contact material layer 306 and the lower portion of semiconductor column 302.

A method of manufacturing a semiconductor device according to an embodiment of the present invention has been described in the above sections. Thereafter, a back-end of line process may be performed according to actual requirements. The following is a description of subsequent processes after obtaining the semiconductor structure in FIG. 3F according to two different embodiments.

FIGS. 4A to 4H are cross-sectional views of intermediate stages of a manufacturing method of a semiconductor device according to another embodiment of the present invention.

Figure 4A:
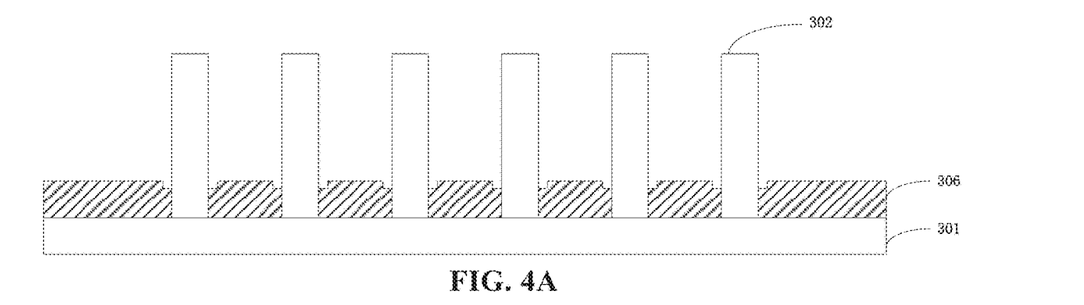
FIGS. 4A to 4H are cross-sectional views of intermediate stages of a manufacturing method of a semiconductor device according to another embodiment of the present invention.

Referring to FIG. 4A, remaining first protective layer 304 is removed, such that a recess is formed in first contact material layer 306 adjacent to the lower portion of semiconductor column 302. In the case where semiconductor column 302 includes buffer layer 322, buffer layer 322 is also removed.

Figure 4B:
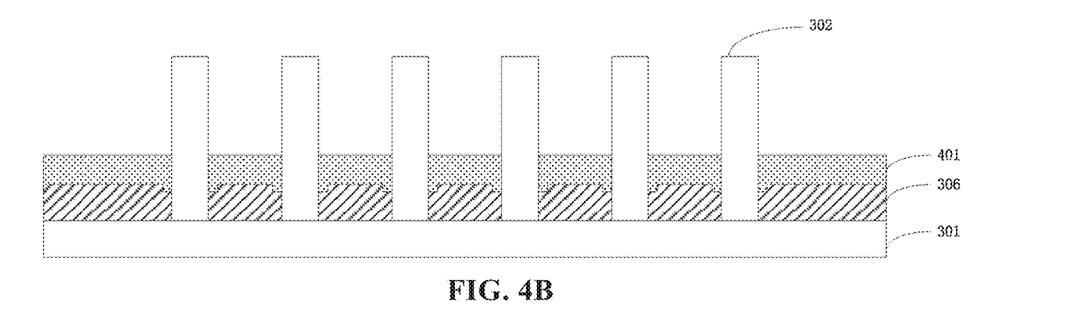

Referring to FIG. 4B, a first insulating material layer 401, such as a dielectric material layer (e.g., silicon oxide), is formed on first contact material layer 306. In the embodiment, the upper surface of first insulating material layer 401 is lower than the upper surface of semiconductor column 302.

Figure 4C:
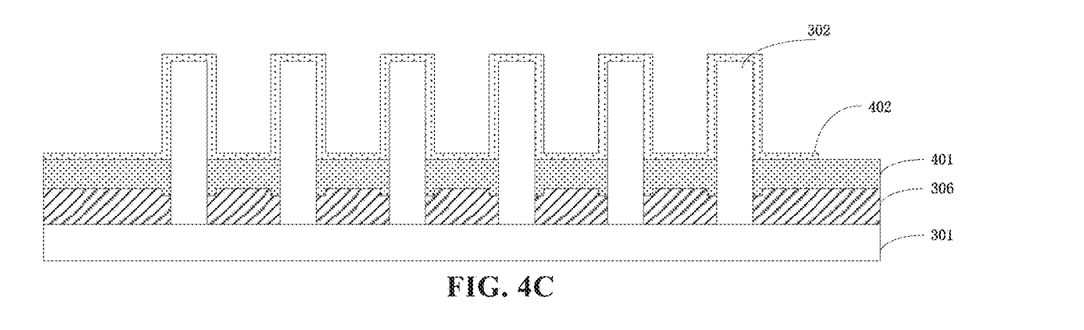

Referring to FIG. 4C, a gate dielectric material layer 402, e.g., silicon oxide, is formed on the surface (including the upper surface and sidewalls) of semiconductor columns 302 and on the surface of first insulating material layer 401.

Figure 4D:
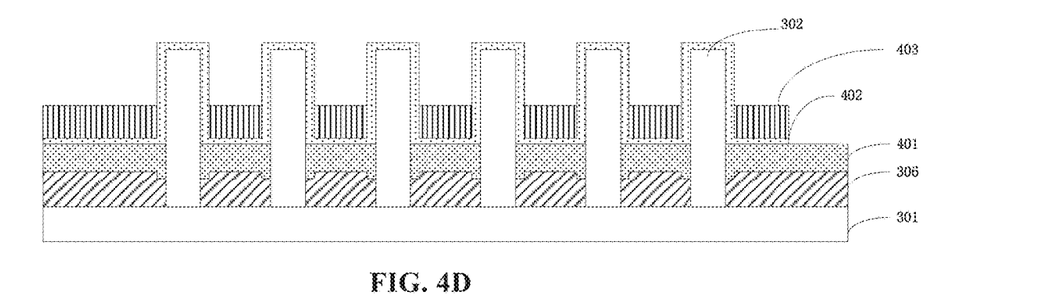

Referring to FIG. 4D, a gate material layer (e.g., a metal material layer) 403 is formed on gate dielectric material layer 402. In the embodiment, the upper surface of gate material layer 403 is lower than the upper surface of semiconductor column 302.

Figure 4E:
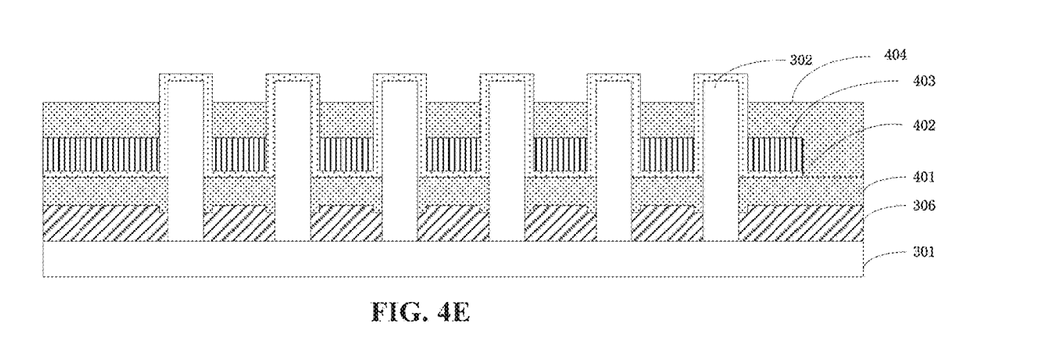

Referring to FIG. 4E, a second insulating material layer (e.g., a silicon oxide layer) 404 is formed on gate material layer 303. In the embodiment, the upper surface of second insulating material layer 404 is lower than the upper surface of semiconductor column 302.

Figure 4F:
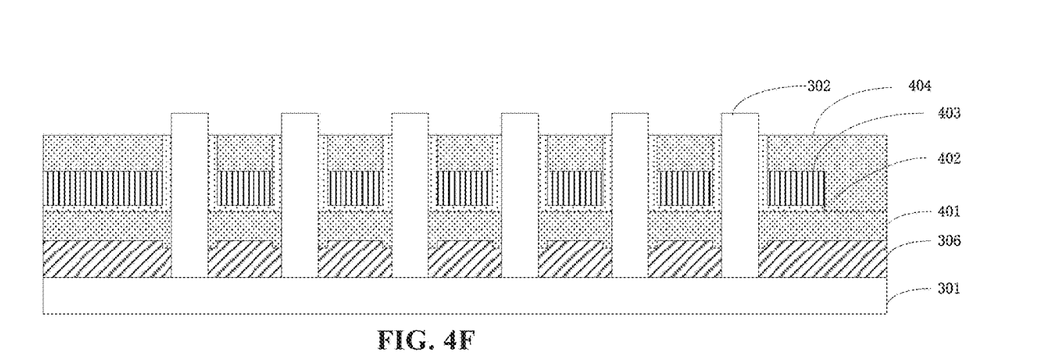

Referring to FIG. 4F, a portion of gate dielectric material layer 402 on an upper portion of semiconductor column 302 above the upper surface of second insulating material layer 404 is removed to expose the upper portion of semiconductor column 302.

Figure 4G:
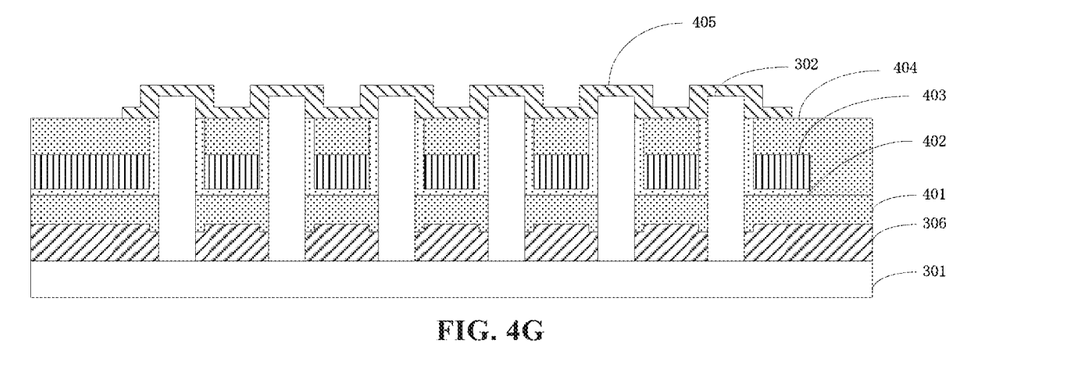

Referring to FIG. 4G, a second contact material layer 405 is formed on the exposed upper portion of semiconductor column 302. In one embodiment, second contact material layer 405 may include tungsten, nickel, cobalt, titanium, or platinum.

Figure 4H:
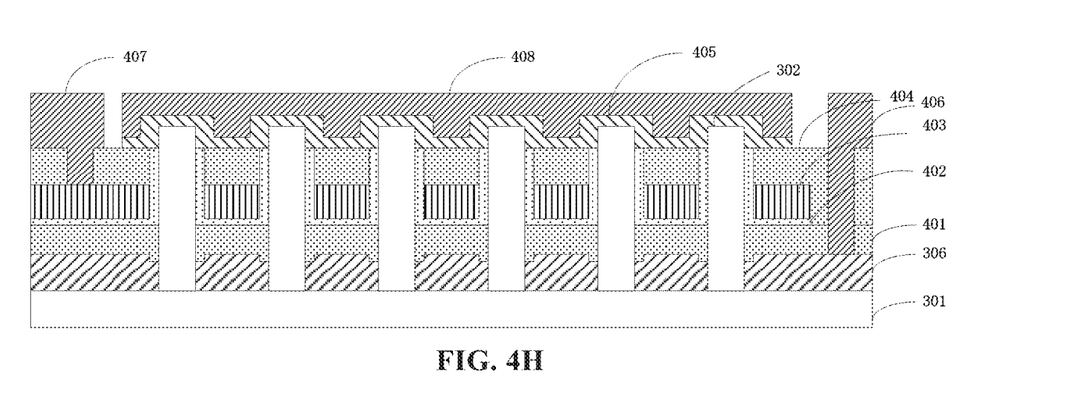

Referring to FIG. 4H, a first contact 406 is formed extending to first contact material layer 306, a second contact 407 is formed extending to gate material layer 403, and a third contact 408 is formed in contact with second contact material layer 405.

In one exemplary embodiment, a first contact hole may be formed extending through first insulating material layer 401 and second insulating material layer 404 to first contact material layer 306, a second contact hole may be formed through second insulating material layer 404 to gate material layer 403; and a metal material is then deposited filling the contact holes. Thereafter, the metal material may be patterned to form first contact 406 (also referred to as a source contact), second contact 407 (also referred to as a gate contact), and third contact 408 (also referred to as a drain contact).

FIGS. 5A to 5F are cross-sectional views of intermediate stages of a manufacturing method of a semiconductor device according to yet another embodiment of the present invention. In this embodiment, the first protective layer includes a dielectric material layer, so that the first protective layer may serve as a gate dielectric material layer.

Figure 5A:
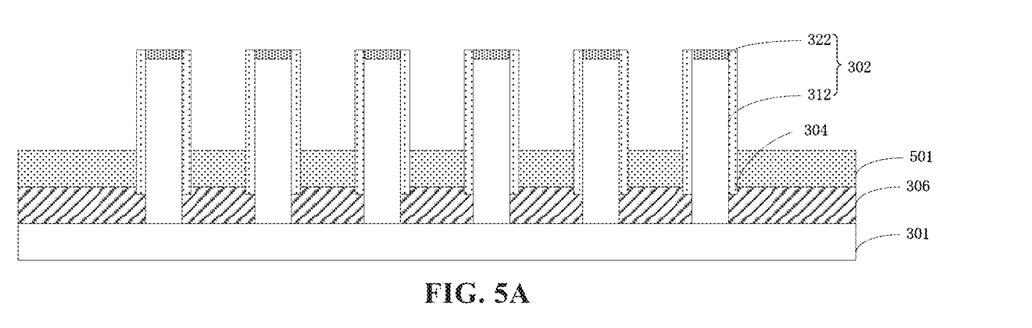
FIGS. 5A to 5F are cross-sectional views of intermediate stages of a manufacturing method of a semiconductor device according to yet another embodiment of the present invention.

Referring to FIG. 5A, a first insulating material layer (e.g., dielectric material) 501 is formed on first contact material layer 306. In the embodiment, the upper surface of first insulating material layer 501 is lower than the upper surface of semiconductor columns 302.

Figure 5B:
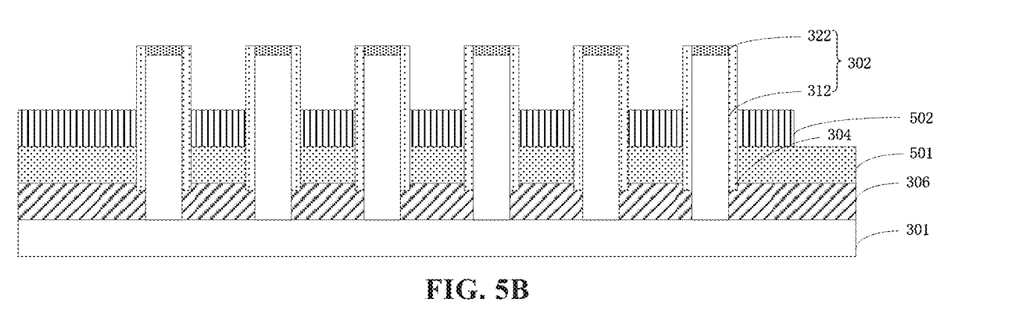

Referring to FIG. 5B, a gate material layer (e.g., a metal material) 502 is formed on first insulating material layer 501. In the embodiment, the upper surface of gate material layer 502 is lower than the upper surface of semiconductor columns 302.

Figure 5C:
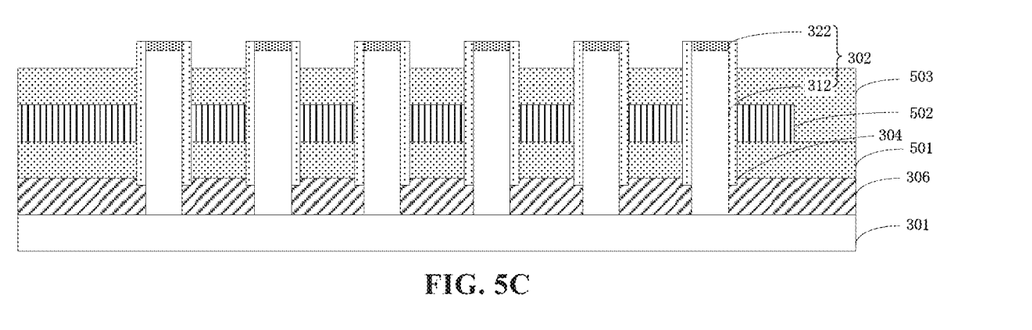

Referring to FIG. 5C, a second insulating material layer (e.g., dielectric material) 503 is formed on gate material layer 502. In the embodiment, the upper surface of second insulating material layer 503 is lower than the upper surface of semiconductor columns 302.

Figure 5D:
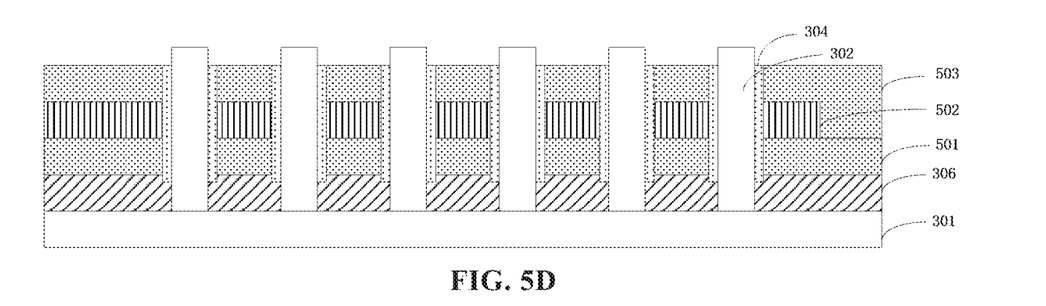

Referring to FIG. 5D, a portion of first protective layer 304 on sidewalls of semiconductor column 302 above the upper surface of second insulating material layer 503 is removed to expose an upper portion of semiconductor column 302. Note that, in the case where semiconductor column 302 includes buffer layer 322, buffer 322 is also removed in this process.

Figure 5E:
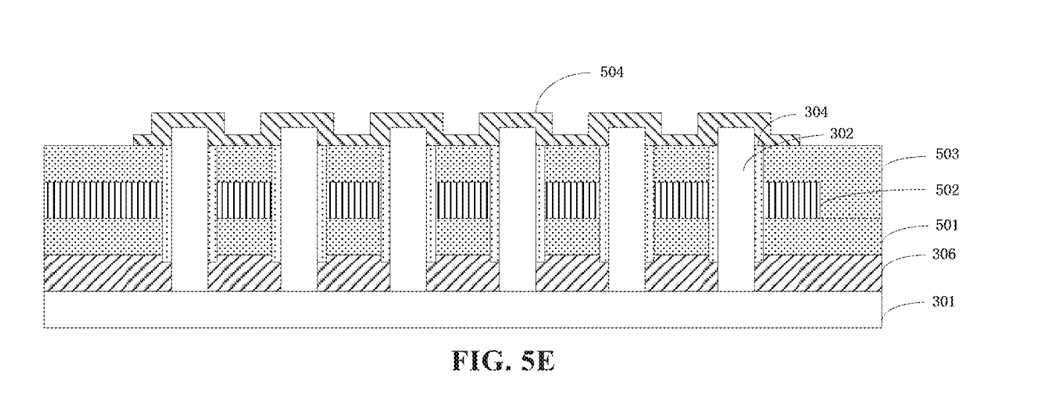

Referring to FIG. 5E, a second contact material layer 504 is formed on the exposed upper portion of semiconductor column 302. In one embodiment, second contact material layer 504 may include tungsten, nickel, cobalt, titanium, or platinum.

Figure 5F:
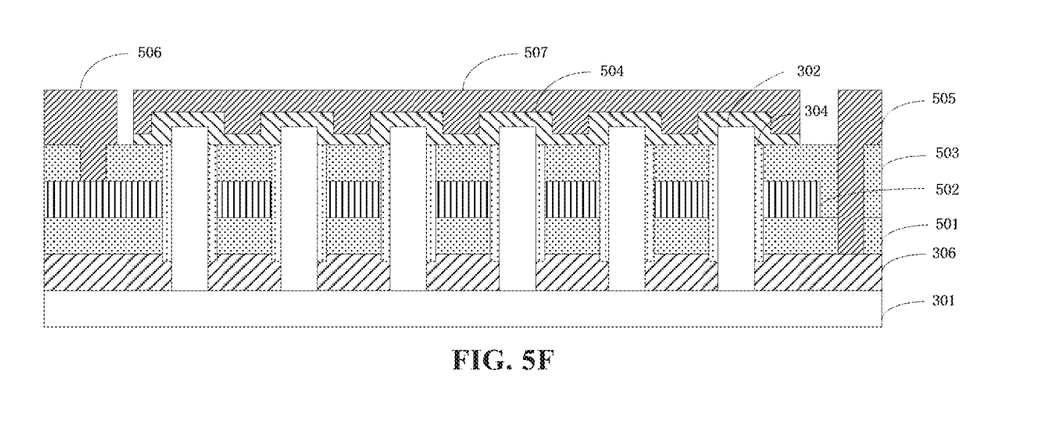

Referring to FIG. 5F, a first contact 505 is formed extending to first contact material layer 306, a second contact 506 is formed extending to gate material layer 502, and a third contact 507 is formed in contact with second material layer 504.

In one exemplary embodiment, contact holes may first be formed in first insulating material layer 501 and second insulating material layer 503; and a metal material is then deposited filling the contact holes. Thereafter, the metal material may be patterned to form first contact 505 (also referred to as a source contact), second contact 506 (also referred to as a gate contact), and third contact 507 (also referred to as a drain contact).

It should be noted that the terms "upper, lower, and middle portions" of the semiconductor column are used in a relational sense and are intended to describe those portions of the semiconductor column that are in the vicinity of the top, the middle and the bottom of the semiconductor column, respectively. As used herein, the upper portion is in the vicinity of the top, the lower portion is in the vicinity of the bottom of the semiconductor column, and the middle portion is between the upper and lower portions.

Embodiments of the present invention also provide a semiconductor device. Referring to FIG. 4A, the semiconductor device includes a substrate 301; a semiconductor column 302 protruding substantially vertically from substrate 301, and a first contact material layer 306 on the upper surface of the substrate and in contact with the lower portion of semiconductor column 302. First contact material layer 306 may include tungsten, nickel, cobalt, titanium, or platinum. First contact material layer 306 has a surface portion adjacent to semiconductor columns 302 that is lower than an upper surface of other portions of first contact material layer 306. As shown in FIG. 4A, first contact material layer 306 has a recess adjacent semiconductor column 302. In one embodiment, the recess surrounds the lower portion of semiconductor column 302.

In one embodiment, referring to FIG. 4G, the semiconductor device also includes a first insulating material layer 401 disposed on first contact material layer 306, a gate dielectric material layer 402 on first insulating material layer 401 and on a portion of sidewalls of semiconductor column 302 exposing an upper portion of the semiconductor column 302.

The semiconductor device also includes a gate material layer 403 on gate dielectric material layer 402, and a second insulating material layer 404 on gate material layer 403. Second insulating material layer 404 has an upper surface substantially flush with an upper surface of gate dielectric material layer 402 on the sidewalls of semiconductor column 302.

The semiconductor device also includes a second contact material layer 405 on the upper portion of semiconductor column 302. Second contact material layer 405 may include a metal, e.g., tungsten, nickel, cobalt, titanium, or platinum.

In one embodiment, referring to FIG. 4H, the semiconductor device further includes a first contact 406 extending to first contact material layer 306, a second contact 407 extending to gate material layer 403, and a third contact 408 in contact with second contact material layer 405.

Embodiments of the present invention also provide a second semiconductor device. Referring to FIG. 5E, the second semiconductor device includes a substrate 301; a semiconductor column 302 protruding vertically from substrate 301, a gate dielectric material layer 304 on a middle sidewall portion of semiconductor column 302 exposing an upper portion and a lower portion of semiconductor column 302, and a first contact material layer 306 on the surface of substrate and in contact with the lower portion of semiconductor column 302.

The second semiconductor device also includes a first insulating layer 501 on first contact material layer 306, a gate material layer 502 on first insulating layer 501, a second insulating material layer 503 on gate material layer 502. Second insulating material layer 503 has an upper surface that is substantially flush with the upper surface of gate dielectric material layer 304.

The second semiconductor device also includes a second contact material layer 504 on the upper portion of semiconductor column 302.

In one embodiment, referring to still FIG. 5E, first contact material layer 306 covers (is on) a portion of gate dielectric layer 304.

In one embodiment, referring to FIG. 5F, the second semiconductor device also includes a first contact 505 extending to first contact material layer 306, a second contact 506 extending to gate material layer 502, and a third contact 507 in contact with second contact material layer 504.

In one embodiment, semiconductor column 302 in each of the above-described semiconductor devices may be a nanowire. In one embodiment, semiconductor column 302 in each of the above-described semiconductor devices may include an array of semiconductor pillars. In one embodiment, semiconductor column 302 in each of the above-described semiconductor devices may include silicon.

It is to be understood that the above described embodiments are intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A method of manufacturing a semiconductor device, comprising:
    providing a substrate structure including a substrate and a semiconductor column vertically protruding from the substrate;
    sequentially forming a first protective layer and a second protective layer on the substrate structure;
    etching a portion of the second protective layer to expose a portion of the first protective layer on the substrate and a portion of the first protective layer on an upper surface of the semiconductor column;
    removing the exposed portion of the first protective layer on the substrate to expose a lower portion of the semiconductor column;
    removing a remaining portion of the second protective layer; and
    forming a first contact material layer on the substrate and in contact with the lower portion of the semiconductor column.

2. The method of claim 1, wherein the substrate structure further comprises an insulating layer on a region of the substrate not covered by the semiconductor column, removing the exposed portion of the first protective layer on the substrate comprises:
    removing the insulating layer.

3. The method of claim 1, wherein the semiconductor column comprises a semiconductor layer and a hardmask layer on the semiconductor layer, the method further comprising, prior to forming the first contact material layer:
    removing the hardmask layer.

4. The method of claim 3, wherein the semiconductor column further comprises a buffer layer between the semiconductor layer and the hardmask layer.

5. The method of claim 1, wherein:
    the first protective layer comprises silicon oxide; and
    the second protective layer comprises silicon nitride.

6. The method of claim 1, further comprising:
    removing a remaining portion of the first protective layer.

7. The method of claim 1, wherein the exposed portion of the first protective layer on the upper surface of the semiconductor column is removed when the exposed portion of the first protective layer on the substrate is removed, the method further comprising:
    forming a first insulating material layer on the first contact material layer;
    forming a gate dielectric material layer on the semiconductor column and on the first insulating material layer;
    forming a gate material layer on the gate dielectric material layer;
    forming a second insulating material layer on the gate material layer, the second insulating material layer having an upper surface lower than an upper surface of the semiconductor column;
    removing a portion of the gate dielectric material layer on the semiconductor column above the upper surface of the second insulating material layer to expose an upper portion of the semiconductor column; and
    forming a second contact material layer on the upper portion of the semiconductor column.

8. The method of claim 1, wherein the first protective layer comprises a dielectric material layer, the method further comprising:
    forming a first insulating material layer on the first contact material layer;
    forming a gate material layer on the first insulating material layer;
    forming a second insulating material layer on the gate material layer, the second insulating material layer having an upper surface lower than an upper surface of the semiconductor column;
    removing the portion of the first protective layer on the upper surface of the semiconductor column and a portion of the first protective layer on sidewalls of the semiconductor column above the upper surface of the second insulating material layer to expose an upper portion of the semiconductor column; and
    forming a second contact material layer on the upper portion of the semiconductor column.

9. The method of claim 8, further comprising:
    forming a first contact extending to the first contact material layer, a second contact extending to the gate material layer, and a third contact in contact with the second contact material layer.

10. The method of claim 8, wherein the second contact material layer comprises tungsten, nickel, cobalt, titanium, or platinum.

11. The method of claim 1, wherein the semiconductor column is a nanowire.

12. The method of claim 1, wherein the semiconductor column comprises an array of semiconductor pillars.

13. The method of claim 1, wherein the semiconductor column comprises silicon.

14. The method of claim 1, wherein the first contact material layer comprises tungsten, nickel, cobalt, titanium, or platinum.

15. The method of claim 1, wherein the first protective layer and the second protective layer have different etching selection ratios.

16. The method of claim 1, wherein the first protective layer comprises silicon dioxide, and the second protective layer comprises carbon-containing silicon nitride (SiCN).

* * * * *